United States Patent [19]
Komi

[11] Patent Number: 5,192,866
[45] Date of Patent: Mar. 9, 1993

[54] SAMPLE-MOVING AUTOMATIC ANALYZING APPARATUS

[75] Inventor: Hideto Komi, Mukou, Japan

[73] Assignee: Shimadzu Corporation, Kyoto, Japan

[21] Appl. No.: 730,422

[22] Filed: Jul. 16, 1991

[30] Foreign Application Priority Data

Jul. 26, 1990 [JP] Japan .................................. 2-200278

[51] Int. Cl.$^5$ ............................................ H01J 37/26
[52] U.S. Cl. ................................... 250/310; 250/492.2
[58] Field of Search ............ 250/306, 310, 397, 492.22

[56] References Cited

U.S. PATENT DOCUMENTS

| | | | |
|---|---|---|---|
| 4,020,343 | 4/1977 | Shimaga et al. | 250/310 |
| 4,494,004 | 1/1985 | Mauer et al. | 250/492.22 |
| 4,537,477 | 8/1985 | Takagi et al. | 250/310 |
| 4,853,870 | 8/1989 | Yasutake et al. | 250/492.22 |
| 4,857,731 | 8/1989 | Tagata | 250/310 |

FOREIGN PATENT DOCUMENTS

63-318054 12/1988 Japan.
1-143129 6/1989 Japan.

OTHER PUBLICATIONS

Patent Abstracts of Japan, vol. 10, No. 248 (E-431) (2304), Aug. 26, 1986, & JP-A-61 077 243, Apr. 19, 1986.
Patent Abstracts of Japan, vol. 10, No. 129 (E-403) (2186), May 14, 1986, & JP-A-60 258 838, Dec. 20, 1985.
Patent Abstracts of Japan, vol. 13, No. 396 (E-815) (3744), Sep. 4, 1989, & JP-A-1 143 129, Jun. 5, 1989.
Patent Abstracts of Japan, vol. 14, No. 344 (E-955) (4287), Jul. 25, 1990 & JP-A-2 119 036, May 7, 1990.
Patent Abstracts of Japan, vol. 11, No. 92 (E-491) (2539), Mar. 24, 1987, & JP-A-61 243 648, Oct. 29, 1986.

Primary Examiner—Bruce C. Anderson
Attorney, Agent, or Firm—Nikaido, Marmelstein, Murray & Oram

[57] ABSTRACT

A sample is analyzed by irradiating it with a charged-particle beam and detecting characteristic X-rays. The surface of the sample is magnified and displayed on a CRT, and analytical areas, analytical positions and a travel path for the charged-particle beam are designated on the image displayed by the CRT. The travel path of the charged-particle beam is designated by an operator via an input unit while the operator observes the image on the CRT. It is also possible to compute and designate the travel path by an arithmetic unit based on positional coordinate data indicative of the analytical areas, analytical positions and non-irradiated areas without requiring an operation by the operator.

5 Claims, 10 Drawing Sheets

SAMPLE-MOVING AUTOMATIC ANALYZING APPARATUS

BACKGROUND OF THE INVENTION

This invention relates to an apparatus for analyzing a sample by irradiating the sample with the electron beam of an EPMA (electron probe micro. analyzer), etc., and detecting characteristic X-rays or the like emitted by the sample. More particularly, the invention relates to a sample.moving automatic analyzing apparatus of the type described in which the sample is moved to shift the position irradiated by the electron beam.

In a case where there are a plurality of areas at which a sample is to be analyzed by irradiation with an electron beam, the conventional practice is to set the positions of the analytical areas in advance and irradiate the sample with the electron beam based on this setting. In the process of ending the analysis of a certain analytical area and then moving the electron beam to the next analytical area, the electron beam is moved across the shortest distance, namely along a linear path, from the end point of one analyzed area to the starting point of the next area to be analyzed.

Though the surface of a sample has locations which are not suited to irradiation because they readily sustain damage owing to irradiation with the electron beam, the prior-art arrangements do not consider protecting these locations. As a consequence, a problem arises in which the sample is damaged or the apparatus is caused to malfunction as a result of electron.beam irradiation in the process of moving the electron beam. A measure to deal with this problem would be to shield the sample from the electron beam during movement. However, when the electron beam is shielded, it takes time for the electron beam to re.stabilize at the designated acceleration voltage and state of convergence, and another problem that arises is a decline in reproducibility. Still another problem is that a large error is produced when attempting highly precise analysis.

In the specification of Japanese Patent Application Laid-Open No. 1-143129, the application for which was filed by the present applicant, and which has been laid open in Japan, there is disclosed an apparatus in which, when there are a plurality of areas at which a sample is to be analyzed by irradiation with an electron beam, analytical conditions and analytical positions on a sample in a plurality of mappings are set by an operator and an analytical schedule is entered. Whenever a mapping ends, a mapping-end signal is transmitted, the next analytical condition and analytical position are set, and a mapping.start signal is transmitted. However, in the disclosed apparatus, no consideration is given to movement of the electron beam between analytical positions, and there is the possibility that the sample will be damaged owing to irradiation with the electron beam during such movement. Further, in the specification of Japanese Patent Application Laid-Open No. 63-318054, the application for which was filed by the present applicant, and which has been laid open in Japan, there is disclosed art in which a path along which the electron beam is scanned is designated by an input unit such as a mouse or tracking ball. However, the above.mentioned problems still arise since no consideration is given to movement of the electron beam other than movement along the scanning path.

SUMMARY OF THE INVENTION

An object of the present invention is to eliminate the aforementioned problems and provide a sample.moving sample and apparatus malfunction during irradiation with an electron beam can be prevented by moving the electron beam between analytical areas while irradiation of unsuitable locations with the electron beam is avoided.

According to the apparatus of the invention, the sample is observed under an optical microscope, the image from the microscopic is picked up by a television camera, and the resulting video signal is displayed on a CRT. While viewing the image displayed on the CRT, an operator selects areas to be analyzed, the positions at which analysis is to take place, and non.irradiated areas at which irradiation is not to be performed, and the operator then sets a path of travel of the electron beam between analytical areas or analytical positions in such a manner that the electron beam will not pass through the non irradiated areas. The setting of the path of travel is performed by designating it on the CRT image by means of a mouse or cursor and then having a computer read the designated path of travel. Further, the setting of the path of travel can be carried out by having a travel-path computing unit compute coordinate data indicative of the analytical areas, analytical positions and non-irradiated areas displayed on the CRT.

The apparatus of the invention is so arranged that a sample stage drive unit is driven and controlled by the travel-path data stored in the computer, whereby the optic axis of the electron beam is moved along the travel path. After the electron beam has been moved along the travel path to the next area to be analyzed, this area is scanned by the electron beam and analyzed. The scanning is performed by the sample-stage drive unit or by a scanning coil.

As described above, damage to the sample by irradiation with the electron beam can be prevented by having a computer move the electron beam along the travel path to move the electron beam between areas to be analyzed.

Other features and advantages of the present invention will be apparent from the following description taken in conjunction with the accompanying drawings, in which like reference characters designate the same or similar parts throughout the FIGURES thereof.

DESCRIPTION OF THE PREFERRED EMBODIMENTS

Figure 1:
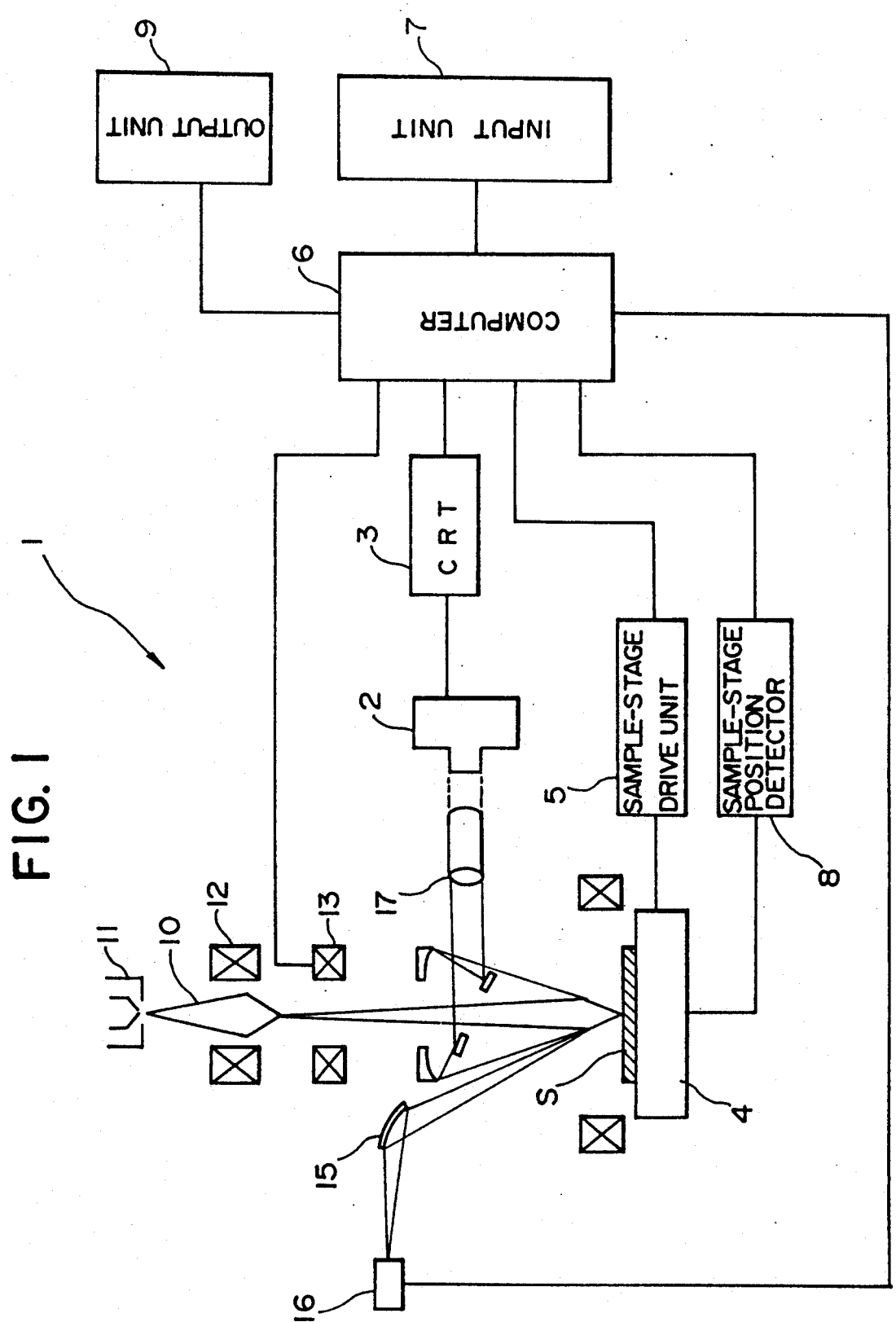
FIG. 1 is a block diagram illustrating a sample. moving automatic analytical apparatus according to the present invention.

As illustrated in FIG. 1, an electron probe microanalyzer 1 is provided with an optical microscope 17. The image of the sample surface magnified by the optical microscope 17 is picked up by a television camera 2 and displayed on a CRT 3. The picture signal of the sample surface displayed on CRT 3 is fed into a computer 6. The electron probe microanalyzer 1 is so adapted that an electron beam 10 generated by an electron gun 11 irradiates a sample S, which emits characteristic X-rays that are detected by an X-ray detector 16. The detection signal from the X-ray detector 16 enters the computer 6, which subjects the signal to signal processing and then displays the result on an output unit 9. The sample S is placed on a sample stage 4 via a sample holder or the like. The sample stage 4 is unit 5, which is controlled by a control signal from the computer 6. The position of the sample stage 4 is detected by a stage.position detecting unit 8, which produces a position signal and inputs this signal to the computer 6. Also connected to the computer 6 is an input unit 7, such as a mouse, a joy stick, a light pen or a cursor. The input unit 7 is for designating electron-beam analyzing areas on the sample S, areas on the sample that are to avoid being irradiated with the electron beam, and an electron.beam travel path on the sample S.

Figure 2:
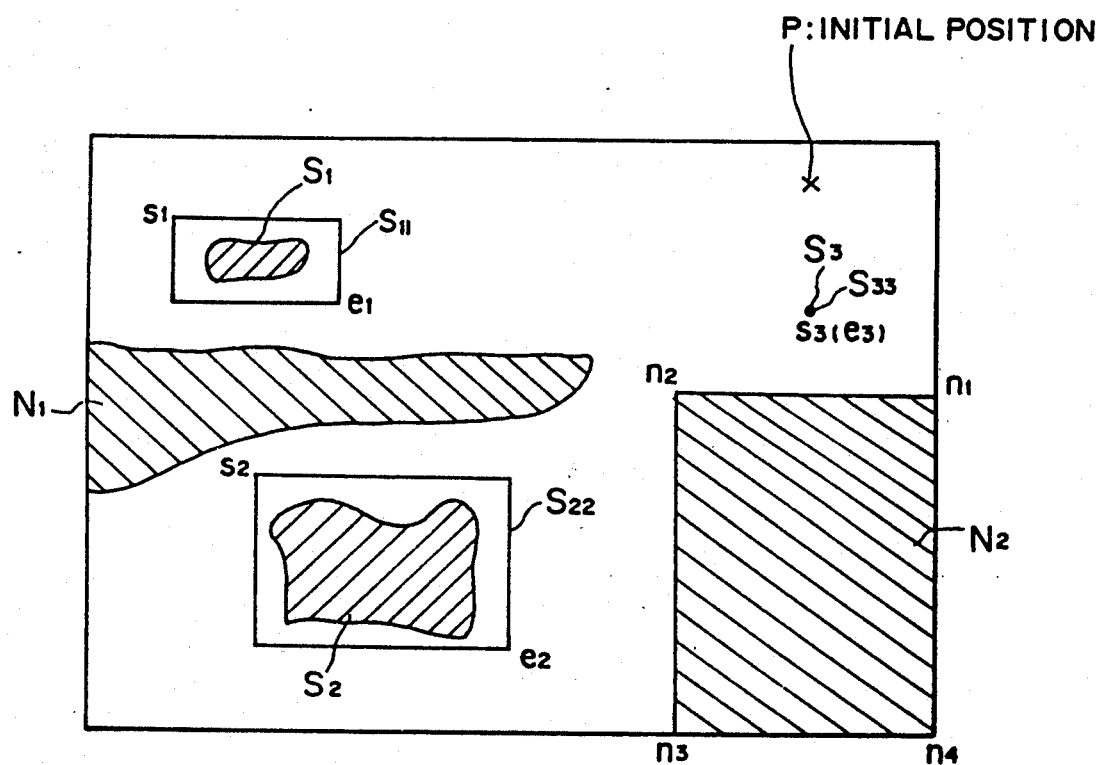
FIG. 2 is a diagram showing the image of a sample surface displayed on the CRT of the sample-moving automatic analytical apparatus according to the present invention.
Figure 3:
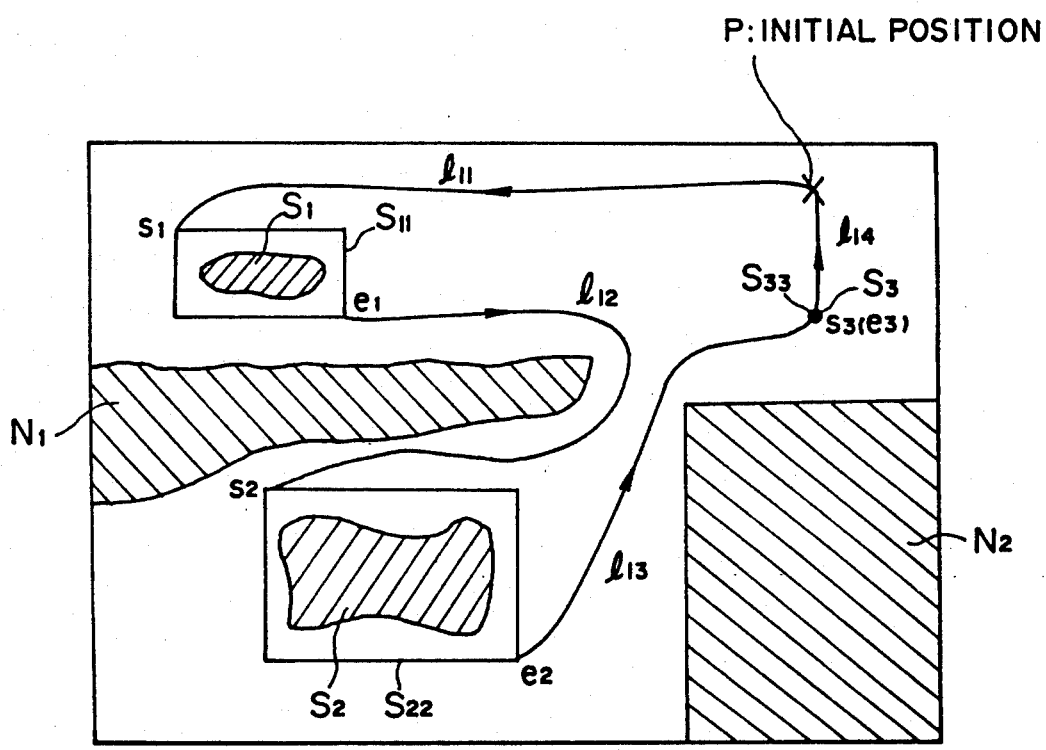
FIG. 3 is an explanatory view of a travel path illustrating a first embodiment of the present invention.
Figure 4:
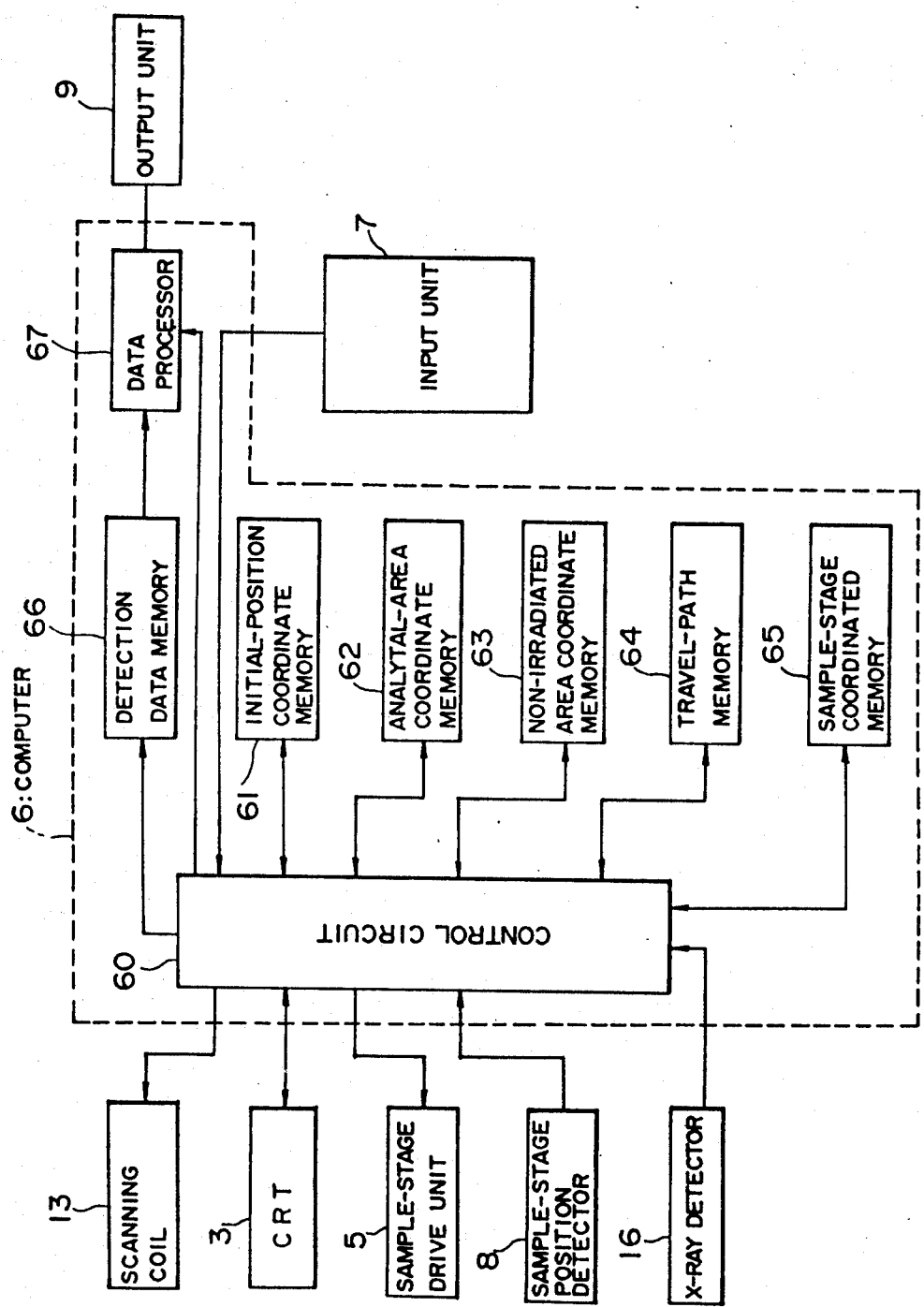
FIG. 4 is a block diagram of an arrangement for setting a travel path illustrating a first embodiment of the present invention.

A first embodiment of the present invention will now be described with reference to FIGS. 1, 2, 3 and 4. FIG. 2 is a magnified image of the sample surface displayed on the CRT 3. Portions $S_1$, $S_2$, $S_3$ to be analyzed are set. To obtain the enlarged image on the CRT 3, the sample surface is magnified by the optical microscope 17 and the image is picked up by the television camera 2 and displayed. The operator observes the image and selects the portions to be analyzed, namely portions $S_1$, $S_2$ (indicated by the slanting lines from right to left) and portion $S_3$ (a point). To irradiate the portions $S_1$, $S_2$ with the electron beam, scanning is performed by deflecting the electron beam back and forth by a scanning coil 13 or by driving the sample stage 4, thereby performing a mapping measurement. Irradiation of the portion $S_3$ with the electron beam involves point-irradiation, and therefore a point measurement is carried out. Scanning of the portions $S_1$, $S_2$ with the electron beam is performed by setting analytical areas $S_{11}$, $S_{22}$ which surround the portions $S_1$, $S_2$, respectively. To set the analytical areas $S_{11}$, $S_{22}$, the input unit 7 is operated to enter data indicative of the positional coordinates of, for example, scanning starting points $s_1$, $s_2$ and scanning end points $e_1$, $e_2$. These items of data enter an analytical area coordinate memory 62 via a control circuit 60 and are stored in this memory. Since the portion $S_3$ is a point, this is the same as an analytical area $S_{33}$, and the starting point $s_3$ and end point $e_3$ of this area have the same coordinates. These items of coordinate data also are inputted to the analyticalarea coordinate memory 62 in the same manner as the analytical areas $S_{11}$, $S_{12}$.

Areas $N_1$, $N_2$ (indicated by the slanting lines from left to right) on the sample surface which must not be irradiated with the electron beam are entered in a manner which will now be described.

The operator observes the enlarged image on the CRT, selects the non.irradiated areas $N_1$, $N_2$ and sets them using the input unit 7. The setting of the non irradiated areas can be carried out by curves or straight lines. More specifically, the non-irradiated area $N_1$ is set by curves, and the non irradiated area $N_2$ is set by straight lines. The setting based on straight lines may be performed by setting the apices of the area. The coordinate data of the non.irradiated areas N are inputted from the input unit 7 and stored in a non-irradiated area coordinate memory 63 via the control circuit 60. The coordinate memory for the non-irradiated area $N_2$ stores the coordinate data $n_1$, $n_2$, $n_3$ and $n_4$.

The initial position of the electron beam is obtained based upon the position information from the CRT 3 or by being set at the input unit 7, and the initial position is stored in an initial.position memory 61. Positional coordinates from a reference point of the sample stage are given by a signal from the stage-position detecting unit 8, and these positional coordinates are stored in a sample-stage coordinate memory 65. Accordingly, the operator drives the sample. stage drive unit 5 to move it in the X and Y directions and select an area to be analyzed. When this is done, the positional coordinates of this area are obtained based upon the values in the sample-stage position memory 65 and the positional coordinates on the magnified image.

By using the coordinate data stored in the initial-position coordinate memory 61, the analytical.area coordinate memory 62 and the non-irradiated area coordinate memory 63, the initial position P, the analytical areas $S_{11}$, $S_{22}$, $S_{33}$ and the non-irradiated areas $N_1$, $N_2$ are superimposed on the image of the sample surface, which is obtained by the optical microscope 17, on the CRT 3, whereby the image shown in FIG. 2 is obtained. A method of setting a travel path l of the electron beam on the magnified image of the sample shown on the CRT 3 in FIG. 2 will now be described with reference to FIG. 3. In the first embodiment, the operator sets the travel path l via the input unit 7 while observing the magnified image of the sample on the CRT 3. The path l comprises a path segment $l_{11}$ from the initial point P to the starting point $s_1$ of the analytical area $S_{11}$, a path segment $l_{12}$ from the end point $e_1$ of the analytical area $S_{11}$ to the starting point $s_2$ of the analytical area $S_{22}$, a path segment $l_{13}$ from the end point $e_2$ of the analytical area $S_{22}$ to the starting point $s_3$ of the analytical area $S_{33}$, and a path segment $l_{14}$ from the end point $e_3$ (the same as $S_3$ in this embodiment) of the analytical area $S_{33}$ to the initial point P. The travel path l is selected to be one which will not cross the non.irradiated areas $N_1$, $N_2$. The information indicative of the travel path l is entered from the input unit 7 and stored in a travel.path memory 64 via the control circuit 60. The image of FIG. 3 can be obtained by superimposing the travel path l on FIG. 2. It it permissible to display each area and the travel path in different colors.

When setting is finished, analysis is performed next. In response to a signal from the input unit 7 or a setting-end signal produced when completion of the travel path l is sensed, the control circuit 60 changes over the mode from the setting mode to an analysis mode. The control circuit 60 reads the information from the travel-path memory 64 and drives the sample.stage drive The amount by which the sample-stage drive unit 5 is driven is computed by the control circuit 60 in such manner that the travel path will be brought to the axis of the electron beam. This computation makes use of the information relating to the travel path stored in the travel.path memory 64, the position information indicative of the position of the sample stage 4, and the initial.position information. Owing to movement of the sample stage 4, the electron beam is moved along the travel path 1 from the initial position P to the starting point $s_1$ of the analytical area $S_{11}$. When the electron beam arrives at the starting point $s_1$, the control circuit 60 sends a scanning signal to the scanning coil 13 or the sample-stage drive unit 5 so as to scan the analytical area $S_1$. When the electron beam reaches the end point $e_1$, scanning ends. A signal from the X-ray detector 16 obtained at the time of scanning is stored in a detection data memory 66 and subjected to data processing by a data processor 67, after which the processed data is outputted to the output unit 9. Also outputted to the output unit 9 is the positional information indicative of the analytical areas.

According to the embodiment described above, the setting of the electron.beam travel path employs an optical microscope and a stage built in the main body of the apparatus. However, it is also permissible to use an externally installed simulator. In addition, it is assumed that the areas in FIG. 2 can be set to a maximum size of 20 cm × 20 cm.

Figure 5:
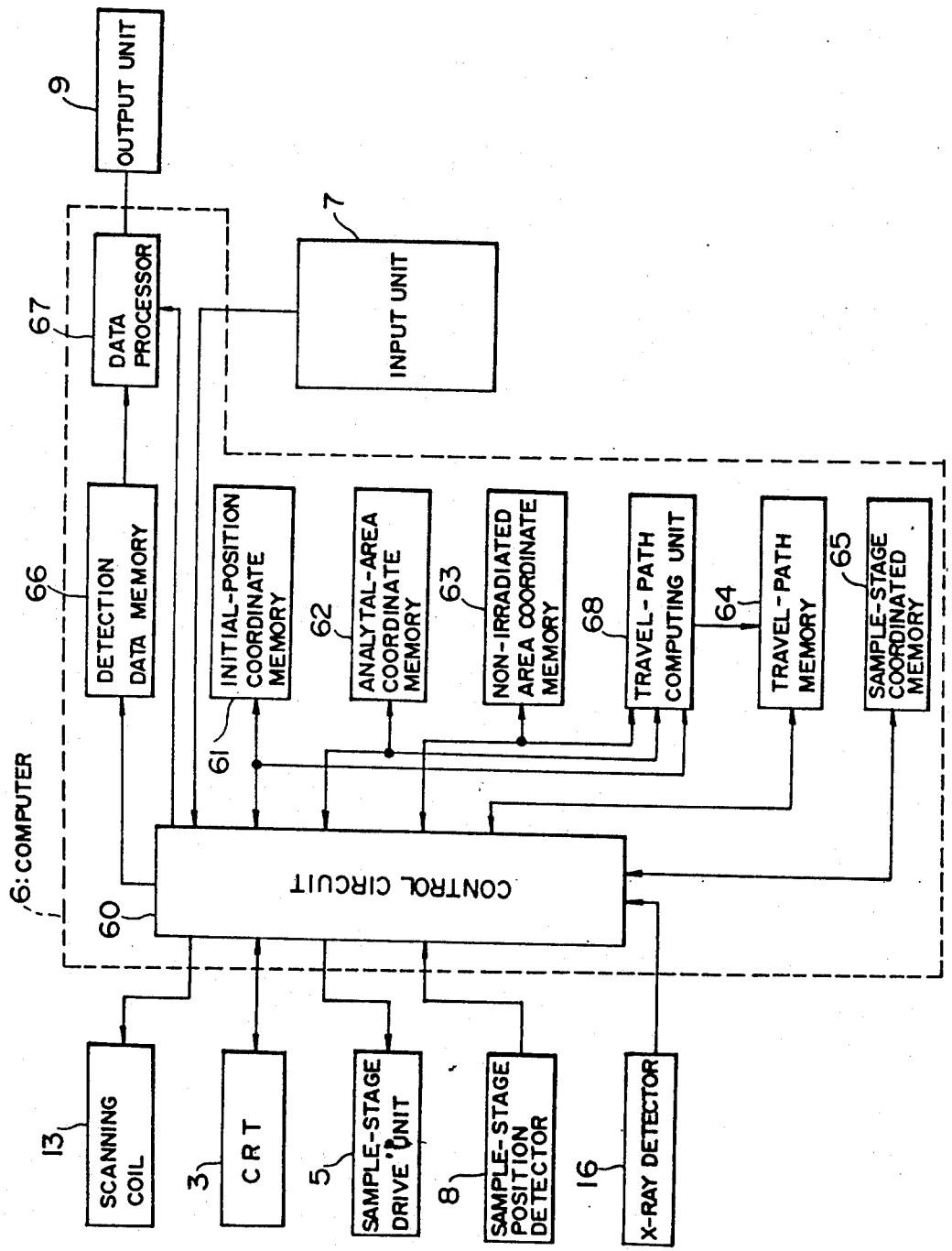
FIG. 5 is a block diagram of an arrangement for setting a travel path according to second, third, fourth, fifth and sixth embodiments of the present invention.
Figure 6:
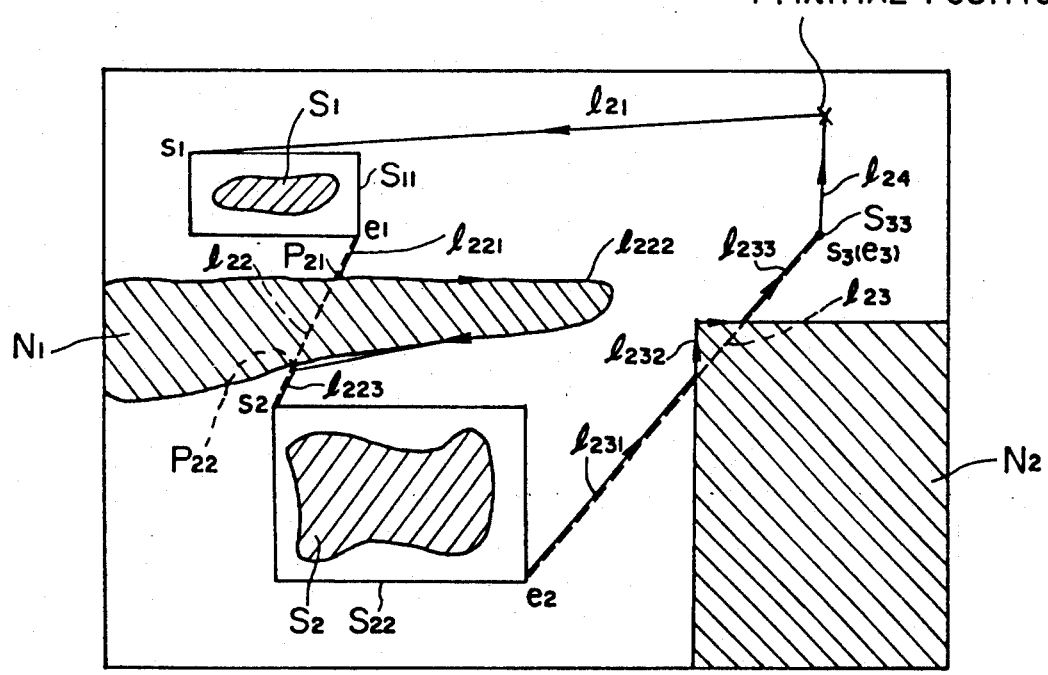
FIG. 6 is an explanatory view of a travel path illustrating the second embodiment.

In the second through sixth embodiments described below, the setting of an initial position P, analytical areas S and non-irradiated areas N is performed in the same manner as in the first embodiment, but the setting The second embodiment of the invention will be described with reference to FIGS. 5 and 6. The initial position P, analytical areas S and non.irradiated areas N are set in the same manner as in the first embodiment. The order of analysis of the analytical areas is decided by an input from the input unit 7 or by a data sequence from the analytical.area coordinate memory 62 storing the analytical areas S, and the travel path on the sample surface is computed by a travel.path computing unit 68. The computed travel path is stored in the travel-path memory 64, after which analysis is carried out in the same manner as in the first embodiment.

Computation of the travel path will be described with reference to FIG. 6. The initial point P and the starting point s of the analytical area S are connected by a straight line since a non.irradiated area is not present between them. Thus a path segment is set. Next, a path segment is set from the end point e of analytical area S to the starting point $s_2$ of the the end point e and the starting point $s_2$ by a straight computation using the data stored in the coordinate memory, and the straight line between end point $e_1$ and intersection $P_{21}$ is adopted as path segment $l_{221}$. The boundary of the non-irradiated area $N_1$ from intersection $P_{21}$ to the other intersection $P_{22}$ is adopted as path segment $l_{222}$. The straight line from intersection $P_{22}$ to the starting point $s_2$ of the analytical area $S_{22}$ is adopted as path segment $l_{223}$. The path $l_{222}$ can be of two types, one of which is the path indicated by the arrows in FIG. 6, and the other of which is a path passing through the outer peripheral portion of the image on the CRT 3. Since there is a possiblity that the outer peripheral portion will be a non-irradiated area, the path $l_{222}$ selected is the one which does not pass through the outer peripheral portion. The path segment from intersection $P_{22}$ to the starting point $S_2$ is adopted as path segment $l_{223}$ again using the straight line $l_{22}$. Thus, the path from end point $e_1$ to starting point $s_2$ is set by $l_{221}$, $l_{222}l_{223}$.

When it is attempted to connect the end point $e_2$ of analytical area $S_{22}$ and the atarting point $S_3$ of analytical area $S_{33}$ by straight line $l_{23}$, the straight line $l_{23}$ passes through the non-irradiated area $N_2$. Accordingly, the path from end point $e_2$ of analytical area $S_{22}$ to the starting point $S_3$ of the next analytical area $S_{33}$ is set as path segments $l_{231}$, $l_{233}$ in such a manner that the path will not pass through the non-irradiated area $N_2$, just as set forth above.

The path segment $l_{24}$ from the end point $e_3$ of analytical area $S_{33}$ to the initiqal position P is set by a straight line since a non-irradiated area is not present between these two points.

Figure 7:
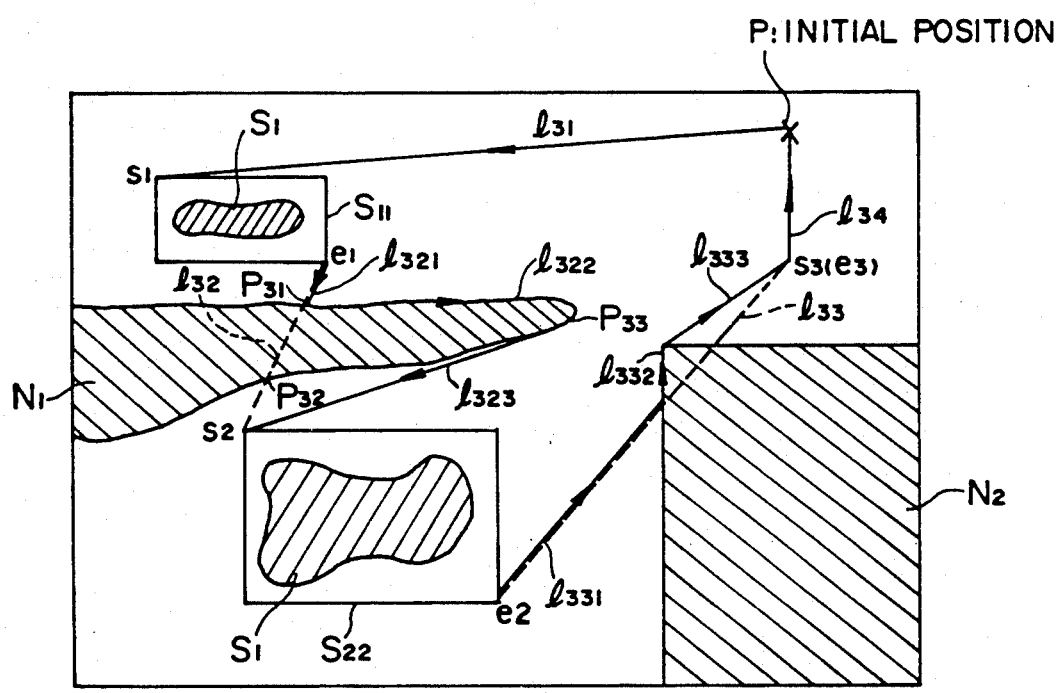
FIG. 7 is an explanatory view of a travel path illustrating the third embodiment.

The third embodiment of the present invention will be described with reference to FIG. 7. Except for the setting of the path of travel, this embodiment is implemented in the same manner as the second embodiment. A linear path segment $l_{31}$ is set between the initial point P and the starting point $s_1$ of the analytical area $S_{11}$ since a non-irradiated area is not present between them. As for the path from the end point $e_1$ of analytical area $S_{11}$ to the starting point $s_2$ of the next analytical area $S_{22}$, first the straight line $l_{32}$ and then points $P_{31}$, $P_{32}$ at which the straight line $l_{32}$ intersects the non-irradiated area $N_1$ are obtained in the same manner as in the second embodiment. A path segment $l_{321}$ from end point $e_1$ to intersection $P_{31}$ is set in the same way as the path segment $l_{221}$ in the second embodiment. A path segment $l_{322}$ from intersection $P_{31}$ to point $P_{33}$ is set along the boundary of the non-irradiated area $N_1$. The point $P_{33}$ is a point at which the straight line from the starting point $s_2$ of the analytical area $S_{22}$ is tangent to the boundary line. Since a non-irradiated area does not exist between the point $P_{22}$ is tangent to the boundary line. Since a non-irradiated area does not exist between the point $P_{33}$ and the starting point $s_2$, these points can be connected by a straight line, with is adopted as a path segment $l_{323}$. Accordingly, the travel path from end point $e_1$ to starting point $s_2$ is set by $l_{321}$, $l_{322}$, $l_{323}$. If it is attempted to connect the end point $e_2$ to the starting point $s_3$ by a straight line $l_{33}$, the line would pass through the non-irradiated area $N_2$. Therefore, this path is set by linear path segments $l_{331}$, $l_{333}$ and the path segment $l_{332}$ of the boundary line in the same manner as the above-mentioned travel path. Analysis based upon the travel-path segments $l_{31}$, $l_{321}$, $l_{322}$, $l_{323}$, $l_{331}$, $l_{332}$, $l_{333}$ and $l_{34}$ is performed in the same manner as in the second embodiment.

Figure 8:
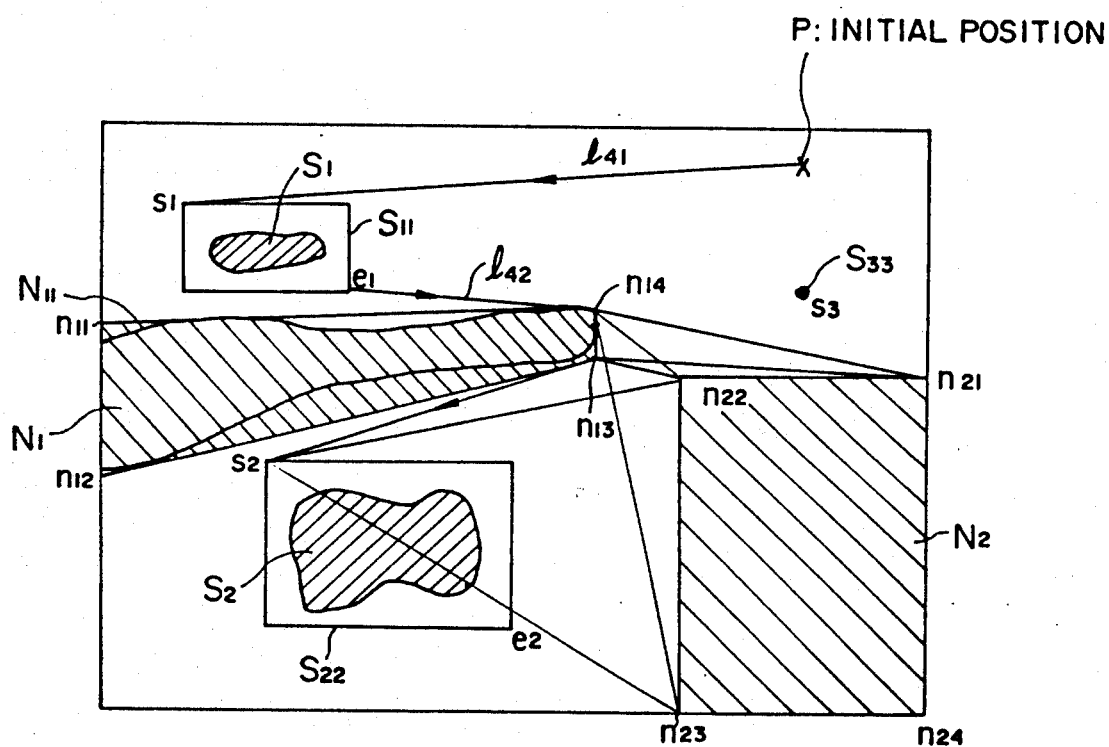
FIG. 8 is an explanatory view of a travel path illustrating the fourth embodiment.

The fourth embodiment of the present invention will be described with reference to FIG. 8. Except for the setting of the path of travel, the fourth embodiment is implemented in the same manner as the second embodiment. A linear path segment $l_{41}$ is set between the initial point P and the starting point $s_1$ of the analytical area $S_{11}$ since a non-irradiated area is not present between them. Since the non-irradiated area $N_1$ is present in the path between the end point $e_1$ of analytical area $S_{11}$ and the starting point $s_2$ of the analytical area $S_{22}$, a path segment $l_{42}$ is set through the following technique: An area $N_{11}$, which is approximated by a polygon containing the non-irradiated area $N_1$ on its inner side, is obtained, and the coordinates of the apices of the polygon are denoted $n_{11}$, $n_{12}$, $n_{13}$, $n_{14}$. Similarly, the coordinates of the apices of the non-irradiated area $N_2$ are denoted $n_{21}$, $n_{22}$, $n_{23}$, $n_{24}$. The path connecting end point $e_1$ and starting point $s_2$ that does not pass through the non-irradiated areas $N_1$, $N_2$ is selected from line segments connecting end point $e_1$ and starting point $s_2$ with the apices of the polygon. Therefore, the shortest path from among this set of line segments is adopted as path segment $l_{42}$ in the travel-path computing unit 68. In FIG. 8, the path segment $l_{42}$ is set by the path segment connecting end point $e_1$ and apex $n_{13}$, and the path segment connecting apex $n_{13}$ and starting point $s_2$. The travel path segment from end point $e_2$ to the starting point $s_3$ of analytical area $S_{33}$ also is set through a procedure similar to that for the travel path segment $l_{42}$. Analysis based upon the path of travel is carried out in the same manner as in the second embodiment.

Figure 9:
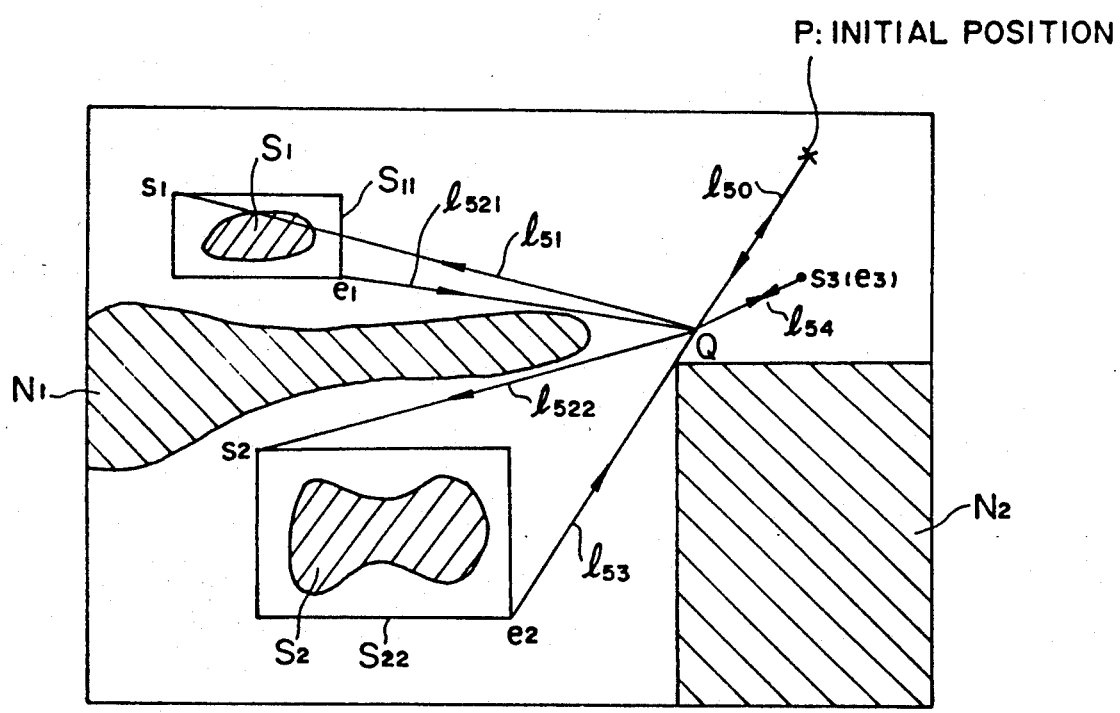
FIG. 9 is an explanatory view of a travel path illustrating the fifth embodiment.

The fifth embodiment of the present invention will be described with reference to FIG. 9. Except for the setting of the path of travel, the fifth embodiment is implemented in the same manner as the second embodiment. A point Q is found on the CRT image, and a path of travel is set using the point Q as a relay point. The point Q is connected to the initial point P, the starting points $s_1$, $s_2$, $s_3$ and end points $e_1$, $e_2$, $e_3$ of the analytical areas by straight lines $l_{50}$, $l_{51}$, $l_{521}$, $l_{522}$, $l_{53}$ and $l_{54}$, respectively. These straight lines do not intersect the non-irradiated areas $N_1$, $N_2$. When the point Q has been found, the above-mentioned straight lines are adopted as the path segments, and the travel path is set as the path segments from the initial point P to point Q, from point Q to starting point $s_1$, from end point $e_1$ to point Q, from point Q to starting point $s_2$, from end point $e_2$ to point Q, from point Q to starting point $s_3$, from end point $e_3$ to point Q, and from point Q to the initial point P. Analysis based upon this path of travel is performed in the same manner as in the second embodiment.

Figure 10:
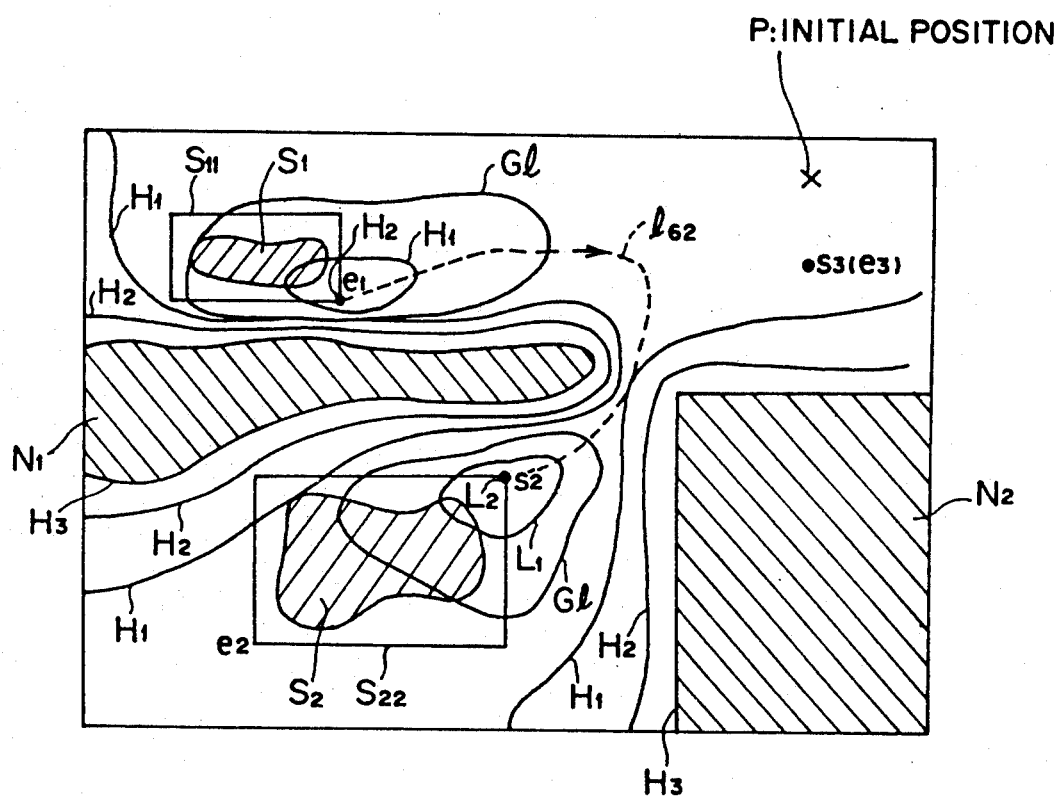
FIG. 10 is an explanatory view of a travel path illustrating the sixth embodiment.

The sixth embodiment of the present invention will be described with reference to FIG. 10. Except for the setting of the path of travel, the sixth embodiment is implemented in the same manner as the second embodiment. In FIG. 10, a path segment $l_{62}$ from the end point $e_1$ of analytical area $S_{11}$ to the starting point $s_2$ of analytical area $S_{22}$ will be described. Potential fields are considered within the image on the CRT, the potential of end point $e_1$ is set to be higher than that of starting point $s_2$, and the direction of the path of travel from end point $e_1$ to starting point $s_2$ is decided as the direction of the potential gradient. For example, in descending order, $H_3$, $H_2$, $H_1$, Gl, $L_1$, $L_2$ are decided as potentials, in which $H_2$ is adopted as the potential of end point $e_1$ and $L_2$ is adopted as the potential of starting point $S_2$. When this is done, a path of travel $l_{62}$ is selected as being that obtained by successively connecting the gradient directions and the respective potential points from potential $H_2$ to potential $L_2$. If $H_2$ is adopted as the potential of the non irradiated areas $N_1$, $N_2$, this potential will be higher that the potential $H_1$ of the end point $e_1$. Accordingly, the path of travel $l_{62}$ is set without it intersecting the non.irradiated areas $N_1$, $N_2$. By a similar technique, paths are set from the initial point P to starting point $s_1$, from end point $e_2$ to starting point $s_3$, and from end point $e_3$ to the initial point p. Analysis based upon this path of travel is performed in the same manner as in the second embodiment.

The levels of the potentials of the starting and end points can be reversed if desired.

In accordance with the present invention, it is possible to move an electron beam between analytical areas while avoiding portions which must not be irradiated with the electron beam. This makes it electron beam and without damaging the sample.

As many apparently widely different embodiments of the present invention can be made without departing from the spirit and scope thereof, it is to be understood that the invention is not limited to the specific embodiments thereof except as defined in the appended claims.

What is claimed is:

1. A sample-moving auitomatic analyzing apparatus for analyzing a sample by irradiating the sample with a charged-particle beam, comprising:

magnification means for optically magnifying the surface of the sample, creating a magnified image;

display means coupled to said magnification means for displaying the magnified image of the surface of the sample on a CRT at a fixed magnification;

setting means for setting analytical areas or analytical positions on the image of the sample displayed on said CRT;

designating means for designating a travel path of the charged-particle beam between said analytical areas or said analytical positions, said designating means including an input unit for inputting said analytical areas or analytical positions, as well as non-irradiated areas, a travel path computing unit for computing the travel path based upon input data from said input unit, said travel path computing unit having means for computing a straight line connecting an end point and a starting point of analytical areas or analytical positions which are mutually adjacent to each other in an order of analysis, and means for obtaining points of intersection at which the straight line intersects the non-irradiated area, said travel path computing unit also having a travel path memory for storing data indicative of the travel path inputed from said input unit, wherein said travel path computing unit computes a plurality of diverse, specialized travel paths based on said input data, to prevent irradiation of the non-irradiated areas; and moving means for moving a sample stage said moving means including means for computing an amount of drive of the sample stage based upon data indicative of a designated position or travel path on said CRT, and a sample stage drive in such a manner that a point on the sample corresponding to the travel path designated by said designating means will be brought to an optic axis of the charged-particle beam.

2. The apparatus according to claim 1, wherein said travel-path computing unit includes:

means for computing a straight line connecting an end point and a starting point of analytical areas or analytical positions that are mutually adjacent each other in the order of analysis;

means for obtaining points of intersection at which said straight line intersects a non-irradiated area; and means for obtaining a line segment which is tangent to a boundary of the non-irradiated area and passes through the starting point.

3. The apparatus according to claim 1, wherein said travel-path computing unit includes:

means for obtaining line segments which connect an apex of a non irradiated area, which is approximated by a polygon, with a starting point and end point of analytical areas or analytical positions that are mutually adjacent to each other in the order of analysis; and means for obtaining the shortest one of said line segments.

4. The apparatus according to claim 1, wherein said travel-path computing unit includes means for obtaining line segments which connect each end point and starting point of the analytical areas or analytical positions, without intersecting a non-irradiated area, on the image of the sample displayed on said CRT.

5. The apparatus according to claim 1, wherein said travel path computing unit includes:
means for forming potential fields by applying different potentials to each starting point and end point of the analytical areas or analytical positions, and to the non-irradiated areas; and
means for obtaining gradients of the potential fields.

* * * * *